United States Patent
Umezawa

(10) Patent No.: US 10,267,824 B2
(45) Date of Patent: *Apr. 23, 2019

(54) SHUNT RESISTOR

(71) Applicant: DENSO CORPORATION, Kariya, Aichi-pref. (JP)

(72) Inventor: Masayoshi Umezawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 169 days.

This patent is subject to a terminal disclaimer.

(21) Appl. No.: 15/317,240

(22) PCT Filed: Aug. 7, 2015

(86) PCT No.: PCT/JP2015/003978
§ 371 (c)(1),
(2) Date: Dec. 8, 2016

(87) PCT Pub. No.: WO2016/035257
PCT Pub. Date: Mar. 10, 2016

(65) Prior Publication Data
US 2017/0122985 A1 May 4, 2017

(30) Foreign Application Priority Data
Sep. 3, 2014 (JP) .................. 2014-179483

(51) Int. Cl.
*G01R 1/20* (2006.01)
*G01R 15/14* (2006.01)
(Continued)

(52) U.S. Cl.
CPC ........... *G01R 15/146* (2013.01); *G01R 15/00* (2013.01); *H01C 1/08* (2013.01); *H01C 1/144* (2013.01); *H01C 7/13* (2013.01); *H01C 13/00* (2013.01)

(58) Field of Classification Search
CPC .. G01R 1/203; G01R 15/146; G01R 19/0007; G01R 13/02; G01R 15/002; G01R 15/08;
(Continued)

(56) References Cited

U.S. PATENT DOCUMENTS 9,660,404 B2 * 5/2017 Kameko .................. H01C 1/14
2003/0020592 A1 1/2003 Hirasawa
(Continued)

FOREIGN PATENT DOCUMENTS

JP     H05-312847 A    11/1993
JP     H06-224014 A     8/1994
(Continued)

OTHER PUBLICATIONS

U.S. Appl. No. 15/316,595, filed Dec. 6, 2016, Kawamoto.

*Primary Examiner* — Huy Q Phan
*Assistant Examiner* — Raul J Rios Russo
(74) *Attorney, Agent, or Firm* — Posz Law Group, PLC

(57) ABSTRACT

A shunt resistor, at least a part of which has a resistive element with pre-set resistivity, is configured to bridge between two electrodes and detect a current value of a current flowing between the electrodes by detecting a voltage drop in the resistive element. The shunt resistor includes two connecting parts affixed to the electrodes via a conductive adhesive, respectively, and the connecting parts electrically connected to the affixed electrodes, a bridging part bridging between the connecting parts by being extended from one of the connecting parts to the other one of the connecting parts, and two bonding wires used to detect a voltage drop in the resistive element. The two bonding wires are extracted parallel to an extension direction of the bridging part to a same direction.

5 Claims, 5 Drawing Sheets

(51) Int. Cl.
    *G01R 15/00*     (2006.01)
    *H01C 1/144*     (2006.01)
    *H01C 13/00*     (2006.01)
    *H01C 1/08*     (2006.01)
    *H01C 7/13*     (2006.01)

(58) Field of Classification Search
    CPC ...... G01R 15/09; G01R 15/125; G01R 17/04;
                      G01R 19/165; G01R 19/1659
    USPC ............. 324/72, 76.11–76.83, 115, 126, 149
    See application file for complete search history.

(56) References Cited

U.S. PATENT DOCUMENTS

| | | |
|---|---|---|
| 2004/0012480 A1 | 1/2004 | Nakamura et al. |
| 2004/0196139 A1 | 10/2004 | Nakamura et al. |
| 2005/0024806 A1 | 2/2005 | Hirasawa |
| 2007/0144822 A1* | 6/2007 | Tominaga ............ B62D 5/0406 |
| | | 180/444 |
| 2008/0265872 A1* | 10/2008 | Nagashima ............ G01R 1/203 |
| | | 324/126 |
| 2009/0174522 A1 | 7/2009 | Schulz et al. |
| 2013/0221532 A1 | 8/2013 | Fujita et al. |
| 2013/0314165 A1* | 11/2013 | Tsutsumi ............ H01L 23/3107 |
| | | 331/34 |
| 2014/0125429 A1* | 5/2014 | Yoshioka ................. H01C 1/14 |
| | | 333/172 |
| 2015/0260760 A1* | 9/2015 | Katakura ............... G01R 15/04 |
| | | 324/715 |

FOREIGN PATENT DOCUMENTS

| | | |
|---|---|---|
| JP | 2562410 B2 | 12/1996 |
| JP | 2004-221160 A | 8/2004 |
| JP | 2008-082957 A | 4/2008 |
| JP | 2009-098079 A | 5/2009 |
| JP | 2011-003694 A | 1/2011 |
| JP | 2012-233706 A | 11/2012 |
| JP | 2014-078538 A | 5/2014 |

\* cited by examiner

SHUNT RESISTOR

CROSS REFERENCE TO RELATED APPLICATIONS

This application is a U.S. national stage of International Patent Application No. PCT/JP2015/003978 filed on Aug. 7, 2015 and is based on Japanese Patent Application No. 2014-179483 filed on Sep. 3, 2014, the disclosures of which are incorporated herein by reference.

TECHNICAL FIELD

The present disclosure relates to a shunt resistor to which bonding wires used to detect a current value flowing between electrodes are connected.

BACKGROUND ART

A current value is measured by using a shunt resistor according to a resistance value of a resistive element forming the shunt resistor and a potential difference across the shunt resistor.

A current detection resistor described in Patent Literature 1 includes a current-passing part through which a current flows and detection parts protruding from the current-passing part. The detection parts are provided integrally with the current-passing part and detect a current value according to a resistance value of the current-passing part and a potential difference between two detection parts.

A semiconductor module described in Patent Literature 2 includes a connection conductor functioning as a shunt resistor. Bonding wires are bonded to the connection conductor at leg parts which are in contact with switching elements and a lead frame as connection targets. A current value is detected according to a resistance value of the connection conductor and a potential difference between two bonding wires.

PRIOR ART LITERATURES

Patent Literature

Patent Literature 1: JP2004-221160A
Patent Literature 2: JP2013-179744A

SUMMARY OF INVENTION

A current flowing through a resistive element is increasing recently for a shunt resistor employed in an electronic device equipped to, for example, a vehicle. Accordingly, a heating value of the resistive element is also increasing. A need is thus arising from a viewpoint of heat dissipation to directly connect the shunt resistor to a member having a large heat capacity and relatively high heat conductivity, such as a lead frame.

Density of a magnetic flux induced by a current also becomes higher as a current flowing through the resistive element increases and the magnetic flux induces an electromotive force to a peripheral circuit.

According to the technique described in Patent Literature 1 routing of the detection parts can be machined to a shape substantially unsusceptible to an error of a detection value caused by resistance of electrode connecting parts and resistance of a detection pattern. However, machining is not easy. Moreover, a lead frame which is a connected-end member of the detection parts has to have a space to provide a corresponding land pattern. Such a space may possibly make a required size reduction infeasible.

Meanwhile, according to the technique described in Patent Literature 2, when the shunt resistor is viewed in a plane from a connection surface on which the bonding wires are connected, the bonding wires are extracted in a direction substantially perpendicular to an extension direction of the shunt resistor. Accordingly, an area of a region enclosed by a path of a sense current flowing through the bonding wires is relatively large and an electromotive force is readily induced by a magnetic flux penetrating through the enclosed region. The induced electromotive force becomes a noise for a potential difference between the bonding wires and accuracy in measurement of a current flowing through the connection conductor may not be sufficiently high in some cases.

In view of the foregoing circumstances, the present disclosure has an object to provide a shunt resistor with a higher degree of accuracy in measurement of a current value.

According to an aspect of the present disclosure, the shunt resistor, at least a part of which has a resistive element with preset resistivity, and is configured to bridge between two electrodes and detect a current value of a current flowing between the electrodes by detecting a voltage drop in the resistive element. The shunt resistor includes two connecting parts affixed to the electrodes via a conductive adhesive, respectively, and the connecting parts electrically connected to the affixed electrodes, a bridging part bridging between the connecting parts by being extended from one of the connecting parts to the other one of the connecting parts, and two bonding wires used to detect a voltage drop in the resistive element. The two bonding wires are extracted parallel to an extension direction of the bridging part to a same direction.

In a typical shunt resistor, a current path including the connecting parts and the bridging part is shorter in a direction orthogonal to the extension direction of the bridging part than in the extension direction. Hence, according to the present disclosure, a distance between the two bonding wires can be shorter than in a configuration in which the bonding wires are extracted in a direction substantially orthogonal to the extension direction. Accordingly, a loop area of a sense current flowing through the bonding wires can be smaller than in a configuration in the related art described in, for example, Patent Literature 1. Consequently, an induced electromotive force due to a current flowing through the resistive element can be restricted. That is to say, a noise superimposed on a potential difference observed between the two bonding wires can be reduced and hence a current value of a current flowing through the resistive element can be detected at a higher degree of accuracy.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

Figure 1:
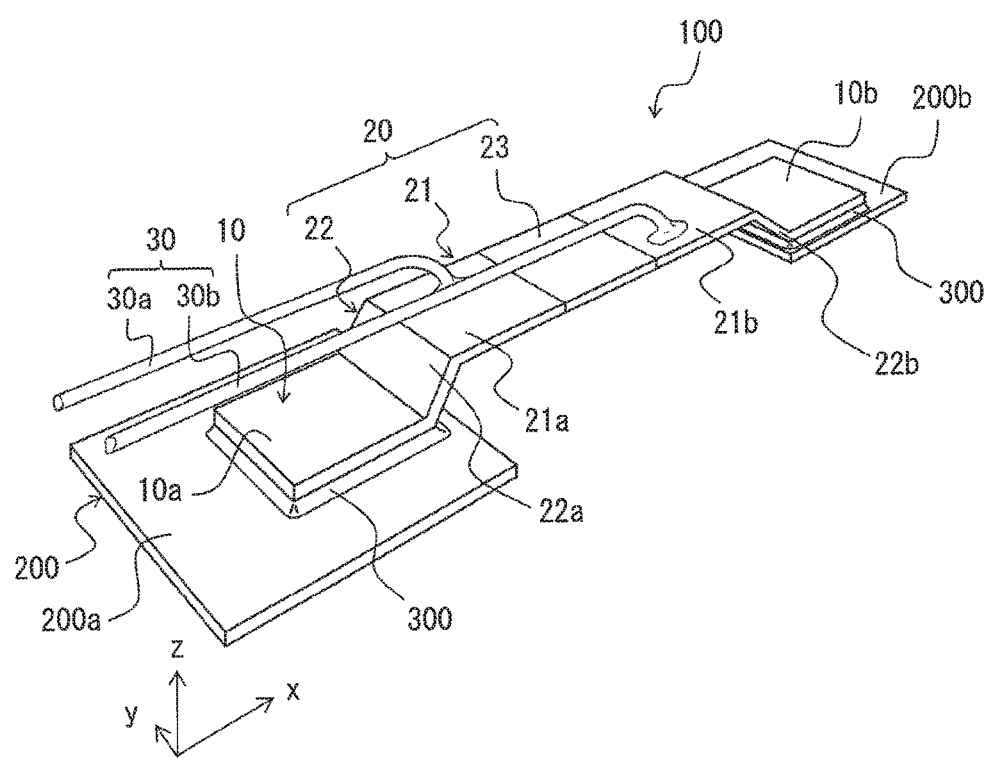
FIG. 1 is a perspective view showing a schematic configuration a shunt resistor according to a first embodiment.

Hereinafter, embodiments of the present disclosure will be described according to the drawings. In respective drawings referred to in the following, same or equivalent parts are labeled with same reference numerals. Directions referred to in the following are an x direction, a y direction orthogonal to the x direction, and a z direction orthogonal to an x-y plane defined by the x direction and the y direction. That is to say, the x direction, the y direction, and the z direction are linearly independent to one another.

First Embodiment

Firstly, a schematic configuration of a shunt resistor of the present embodiment will be described with reference to FIGS. 1 and 2.

As is shown in FIG. 1, a shunt resistor 100 has a surface conforming to the x-y plane and electrically connects two electrodes 200 aligned side by side in the x direction to each other. The shunt resistor 100 described herein connects a first electrode 200a and a second electrode 200b. The electrodes 200 may be, for example, lands provided on a board or a lead frame. In short, a configuration of the electrodes 200 is not particularly limited.

The shunt resistor 100 includes two connecting parts 10 connected to the electrodes 200 via solders 300 as a conductive adhesive and a bridging part 20 bridging between the two connecting parts 10. The bridging part 20 has a main part 21, an intermediate part 22, and a resistive element 23. The shunt resistor 100 also includes bonding wires 30 used to detect a current value of a current flowing through the resistive element 23.

As is shown in FIG. 1, the connecting parts 10 have a first terminal 10a connected to the first electrode 200a and a second terminal 10b connected to the second electrode 200b. The connecting parts 10 are shaped like a plane conforming to the x-y plane. Surfaces of the connecting parts 10 opposing the electrodes 200 are connected to the electrodes 200 via the solders 300.

The main part 21 of the bridging part 20 includes a first main part 21a and a second main part 21b, each of which is a plate-like member conforming to the x-y plane. Likewise, the resistive element 23 is provided so as to conform to the x-y plane and sandwiched between the first main part 21a and the second main part 21b. As is shown in FIG. 1, the first main part 21a, the resistive element 23, and the second main part 21b are aligned in the x direction in order of description and bonded to each other to form an integrated conductor as a whole. The conductor integrally formed of the first main part 21a, the resistive element 23, and the second main part 21b is extended in the x direction to electrically connect the first terminal 10a and the second terminal 10b. The main part 21 together with the resistive element 23 is provided at a higher position than the connecting parts 10 in the z direction.

As is shown in FIG. 1 the intermediate part 22 of the bridging part 20 connects the connecting parts 10 and the main part 21. The main part 21 and the connecting parts 10 are provided integrally via the intermediate part 22. More specifically, the first main part 21a and the first terminal 10 are connected via a first intermediate part 22a and the second main part 21b and the second terminal 10b are connected via a second intermediate part 22b. When the shunt resistor 100 is viewed from a front in the y direction, the bridging part 20 corresponds to an upper base and leg parts of substantially a trapezoidal shape. More specifically, the bridging part 20 forms a trapezoidal shape having a plate-like member integrally formed of the main part 21 and the resistive element 23 as an upper base and the intermediate part 22 as leg parts.

The main part 21 and the intermediate part 22 of the bridging part 20 are conductive parts made of metal, for example, copper and have smaller resistivity than the resistive element 23. The resistive element 23 is chiefly made of, for example, CnMnSn or CuMnNi.

The bonding wires 30 are made of a generally known material, for example, aluminum. A sense current used to detect potential across the bonding wires 30 flows through the bonding wires 30. As is shown in FIG. 1, the bonding wires 30 are a first wire 30a and a second wire 30b. The first wire 30a is bonded to the first main part 21a at a first end and connected to a first sensing electrode 400a (unillustrated) at a second end. The second wire 30b is bonded to the second main part 21b at a first end and connected to a second sensing electrode 400b (unillustrated) at a second end. That is to say, one end of each bonding wire 30 of the present embodiment is bonded to the main part 21 of the bridging part 20 corresponding to the upper base of substantially a trapezoidal shape.

Figure 2:
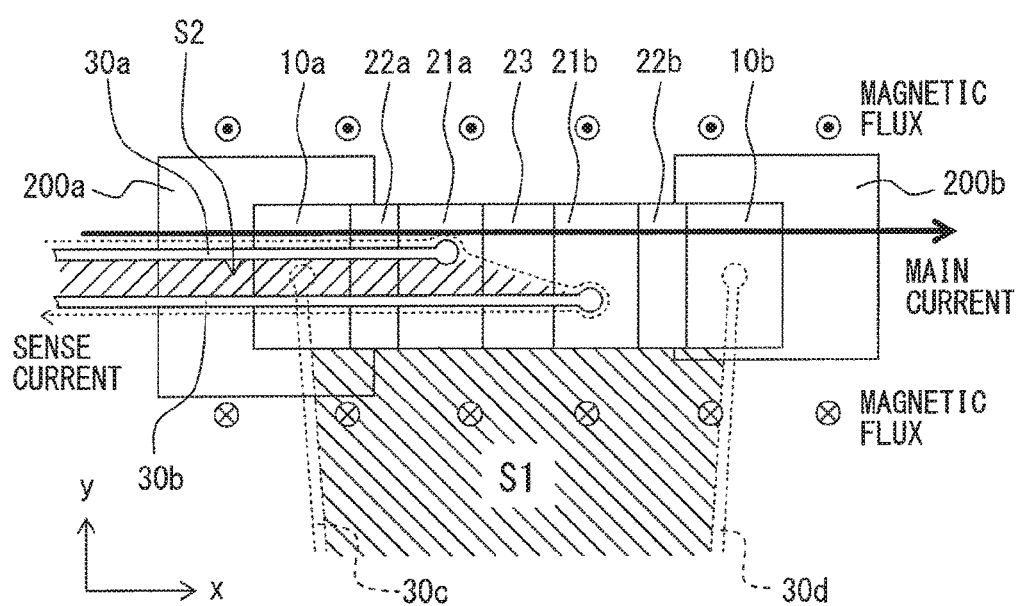
FIG. 2 is a top view showing a relation between a connection configuration of bonding wires and a loop area of a sense current in the shunt resistor.

In the shunt resistor 100 of the present embodiment, as are shown in FIG. 1 and FIG. 2, the two bonding wires 30, that is, the first wire 30a and the second wire 30b are extracted substantially parallel to an extension direction of the bridging part 20 (the x direction of FIG. 1) to substantially a same direction. Herein, "to a same direction" means that both of the first wire 30a and the second wire 30b are extracted toward a left side on a sheet surface of FIG. 2. That is to say, the first wire 30a and the second wire 30b are extended in the x direction and extracted side by side in the y direction. The configuration described above is same as the configuration of the first embodiment except for routing of the bonding wires 30.

An operational-effect of the shunt resistor 100 of the present embodiment will now be described with reference to FIG. 2 to FIG. 4.

In the configuration as above, when a potential difference is generated between the first electrode 200a and the second electrode 200b, a current flows through the resistive element 23 by way of the connecting parts 10, the intermediate part 22, and the main part 21. A current value of a current flowing through the resistive element 23 is detected according to a potential difference observed between the first wire 30a and the second wire 30b and a resistance value of the resistive element 23.

The shunt resistor 100 of the present embodiment is capable of reducing a noise superimposed on a potential difference observed between the first wire 30a and the second wire 30b due to a magnetic flux induced by a current (main current of FIG. 2) flowing between the two electrodes 200, which will be described in detail in the following.

FIG. 2 is a top view showing a connection configuration of the bonding wires 30 in the shunt resistor 100 of the present embodiment and a configuration in the related art in which the bonding wires 30 are connected to the connecting parts 10 substantially orthogonally to the extension direction of the bridging part 20. The bonding wires 30 (the first wire 30a and the second wire 30b) of the present embodiment are indicated by solid lines and bonding wires 30c and 30d in the configuration in the related art are indicated by broken lines.

A magnetic flux induced by the main current passes through a region enclosed by a current path of a sense current flowing through the bonding wires 30 (a shaded region of FIG. 2). When the magnetic flux varies with a variance in main current with time, an induced electromotive force is generated in the current path of the sense current, and the induced electromotive force is undesirably superimposed on a potential difference observed between the first wire 30a and the second wire 30b as a noise. The induced electromotive force becomes larger as an area of the region enclosed by the current path of the sense current (hereinafter, referred to as a loop area) becomes larger.

In the shunt resistor 100 of the present embodiment, the bonding wires 30 are connected to the main part 21 of the bridging part 20 and extracted substantially parallel to each other to the x direction. Hence, a loop area S2 of the present embodiment can be smaller than a loop area S1 in the configuration in the related art. Consequently, an induced electromotive force generated in the current path of the sense current can be smaller than an induced electromotive force generated in the configuration in the related art, which can in turn reduce an influence of a magnetic flux to a potential difference observed between the first wire 30a and the second wire 30b.

Figure 3:
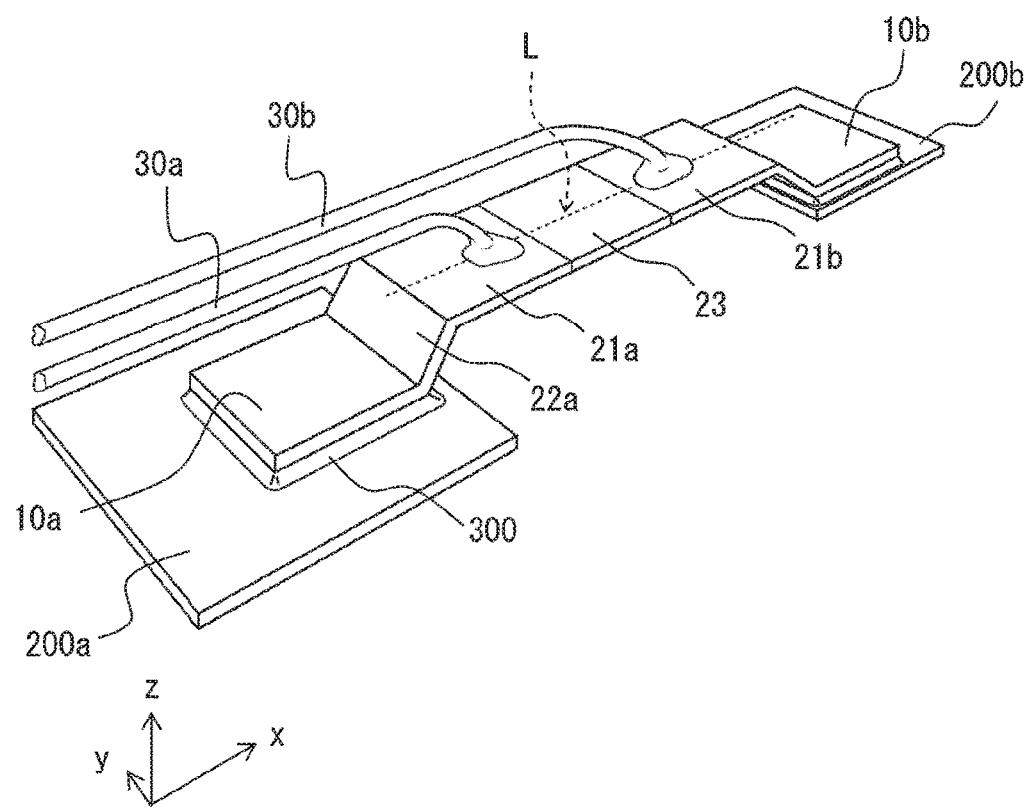
FIG. 3 is a perspective view showing a schematic configuration of the shunt resistor.

When viewed from a front of a bonding surface on which the bonding wires 30 are bonded, it is preferable to configure in such a manner that bonding positions of the first wire 30a and the second wire 30b on the bonding surface fall on a virtual line L along the extending direction (the x direction) as shown in FIG. 3. According to the configuration as above, the first wire 30a and the second wire 30b are extended in the x direction and extracted side by side in the z direction.

According to the configuration as above, y coordinates of the first wire 30a and the second wire 30b on the main part 21 coincide with each other, and when viewed in a plane in the z direction, the first wire 30a and the second wire 30b lie one on the other. Hence, the loop area of the sense current can be smaller than in the configuration as shown in FIGS. 1 and 2 in which the y coordinates are at positions different from each other. Consequently, an induced electromotive force due to the main current can be restricted, which can in turn reduce a noise superimposed on a potential difference observed between the first wire 30a and the second wire 30b.

Figure 4:
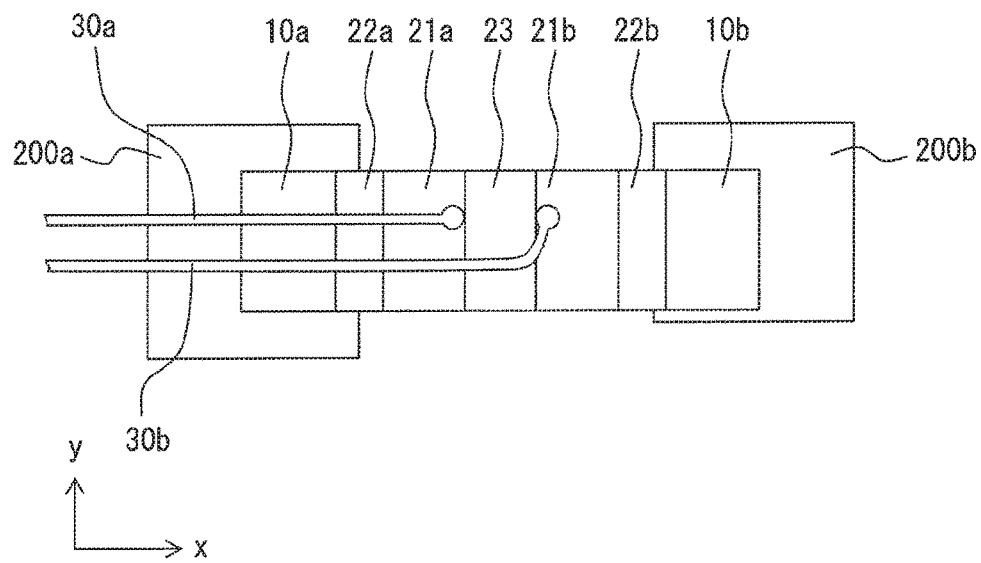
FIG. 4 is a top view showing a schematic configuration of the shunt resistor.

It is preferable to set bonding positions on the main part 21 in close proximity to boundaries between the main part 21 and the resistive element 23 as is shown in FIG. 4, in which case a distance between bonding positions of the is first wire 30a and the second wire 30b becomes substantially a minimum in an extending direction of the bridging part 20 (the x direction in FIG. 4).

When configured as in FIG. 4, an influence of a resistance value and a TCR of the conductive parts of the bridging part 20 except for the resistive element 23 given to a potential difference observed between the first wire 30a and the second wire 30b can be substantially a minimum. Thus, a current value of the main current flowing through the resistive element 23 can be detected at a higher degree of accuracy.

In the shunt resistor 100 of the present embodiment, the bonding wires 30 are bonded to the bridging part 20, to be more specific, the main part 21. Because the solders 300 are interposed between the connecting parts 10 and the electrodes 200 as described above, the solders 300 are not in contact with the main part 21. Hence, presence of the solders 300 does not give an influence to a potential difference observed between the first wire 30a and the second wire 30b. That is to say, a variance in potential difference caused by the solders 300 can be restricted and hence a current value of a current flowing through the resistive element 23 can be detected at a higher degree of accuracy.

In the present embodiment, the bonding wires 30 are bonded to the bridging part 20 of substantially a trapezoidal shape at the main part 21 corresponding to the upper base. Because the bridging part 20 has a trapezoidal arch structure, deflection of the bridging part 20 can be restricted against a force acting on the main part 21 from an upper base side to a lower base side. That is to say, because the bonding wires 30 can be bonded in a stable manner, connection reliability can be enhanced.

Other Embodiment

The present disclosure is not limited to the embodiments mentioned above, and can be changed and modified to various embodiments which are also within the spirit and scope of the present disclosure.

Figure 5:
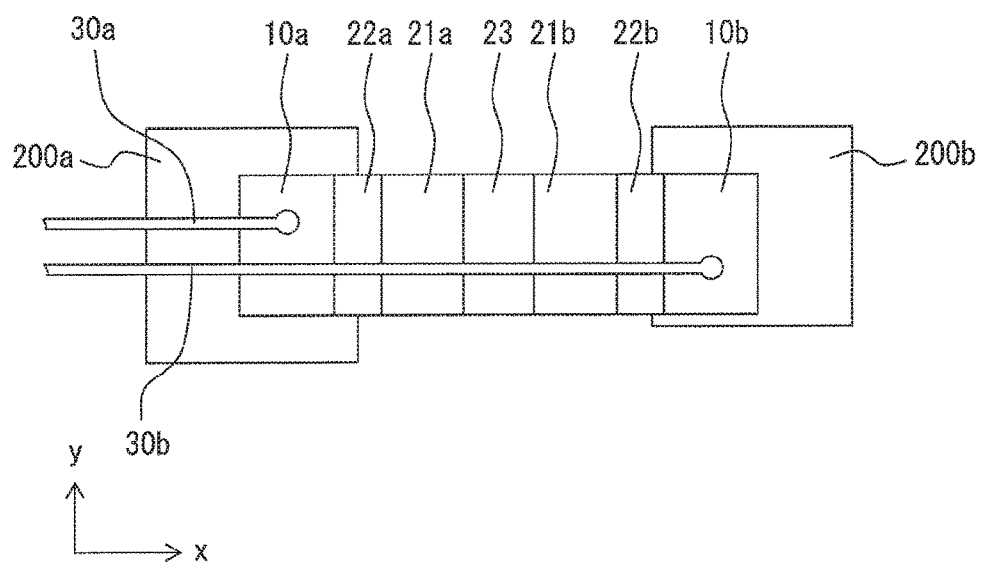
FIG. 5 is a top view showing a schematic configuration of a shunt resistor according to another embodiment.

The embodiment above has described a case where the bonding wires 30 are bonded to the main part 21 of the bridging part 20. However, bonding positions are not particularly limited as long as the first wire 30a and the second wire 30b are extracted substantially parallel to the extension direction of the bridging part 20 to substantially a same direction. An effect of reducing a loop area of a sense current in comparison with the configuration in the related art can be obtained even when, for example, as is shown in FIG. 5, bonding wires 30 are bonded to connecting parts 10.

The respective embodiments above have described a case where the resistive element 23 as a part of the bridging part 20 is sandwiched between the first main part 21a and the second main part 21b. However, the present disclosure is not limited to the described case. The present disclosure can be also applied to a configuration in which connecting parts 10, the main part 21, and the intermediate part 22 are formed integrally using a same material as the resistive element 23. According to the configuration as above, a resistance value used to calculate a current value flowing through the resistive element 23 is calculated using resistivity of the resistive element 23, a sectional area of the bridging part 20, and a distance between bonding positions of the bonding wires 30.

Figure 6:
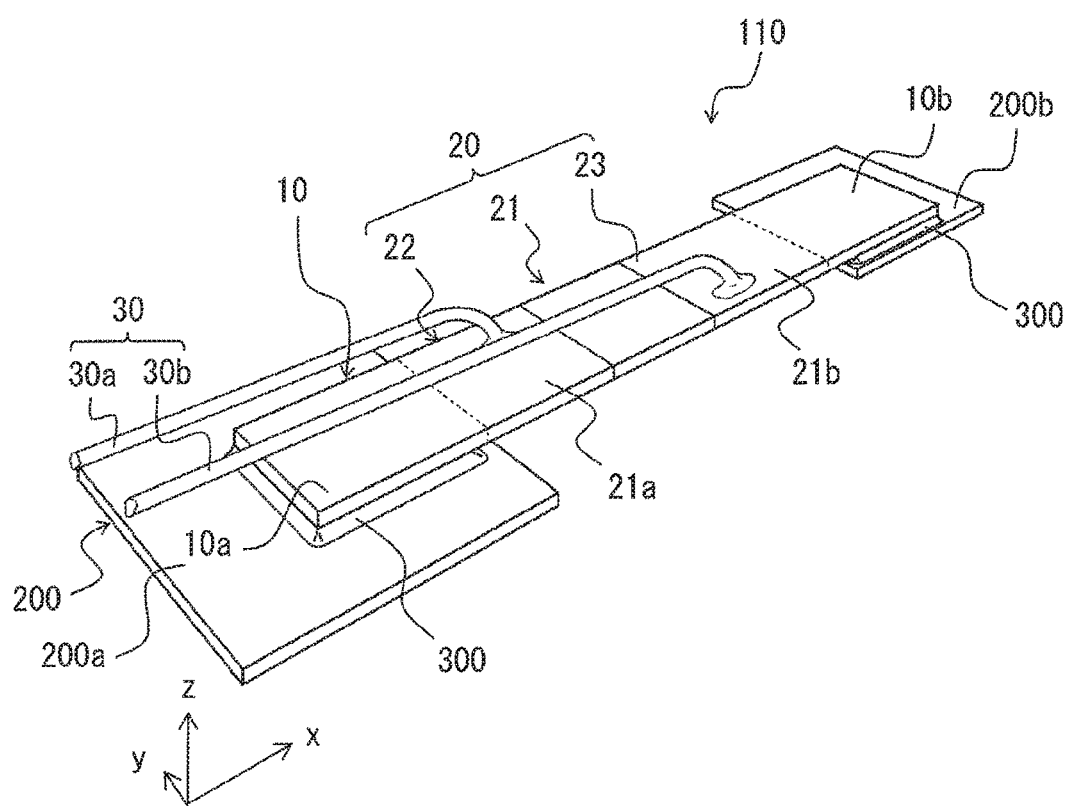
FIG. 6 is a perspective view showing a schematic configuration of a shunt resistor according to still another embodiment.

The embodiment above has described the configuration in which the bridging part 20 is of substantially a trapezoidal shape when viewed from a front in the y direction by way of example. However, the present disclosure is not limited to the configuration as above. For example, the intermediate part 22 may be of a rectangular shape orthogonal to connecting parts 10 or the intermediate part 22 connecting the connecting parts 10 and the main part 21 may be bent. Further, the present disclosure can be also applied to a configuration as is shown in FIG. 6 in which the bridging part 20 does not have an intermediate part and connecting parts 10, the main part 21, and the resistive element 23 together form a flat plate as a whole. Even in the shunt resistor 100 configured as above, the first wire 30a and the second wire 30b are extracted substantially parallel to the extension direction of the bridging part 20 to substantially a same direction.

The embodiment above has described a case where the first wire 30a and the second wire 30b are extracted substantially parallel to the extending direction of the bridging part 20 to substantially a same direction. Herein, "substantially parallel" and "substantially a same" do not necessarily mean that the bonding wires 30 have to be extracted perfectly parallel to the extending direction to exactly a same direction. That is to say, the operational-effect described above can be achieved when the first wire 30a and the second wire 30b are extracted in directions substantially parallel to the extending direction of the bridging part 20 and the extracted directions are substantially same.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A shunt resistor, at least a part of which has a resistive element with pre-set resistivity, and which is configured to bridge between two electrodes and detect a current value of a current flowing between the two electrodes by detecting a voltage drop in the resistive element, the shunt resistor comprising:
   two connecting parts affixed to the two electrodes via a conductive adhesive, respectively, the two connecting parts being electrically connected to the two electrodes;
   a bridging part bridging between the two connecting parts by being extended from one of the two connecting parts to the other one of the two connecting parts; and
   two bonding wires used to detect a voltage drop in the resistive element, wherein:
   the two bonding wires are extracted parallel to an extension direction of the bridging part to a same direction,
   the bridging part is of a protrusion shape with respect to the two connecting parts when viewed in a cross section along the extension direction of the bridging part and orthogonal to a bonding surface on which the two bonding wires are bonded,
   when viewed in a cross section along the extension direction of the bridging part and orthogonal to the bonding surface on which the two bonding wires are bonded,
   the bridging part corresponds to an upper base and leg parts of a trapezoidal shape,
   the resistive element is provided at least to the upper base, and
   the two bonding wires are bonded to the upper base.

2. The shunt resistor according to claim 1, wherein
   when viewed from a front of a bonding surface on which the two bonding wires are bonded, two bonding positions of the two bonding wires on the bonding surface fall on a virtual line along the extension direction of the bridging part.

3. The shunt resistor according to claim 1, wherein
   the two bonding wires are bonded to the bridging part.

4. The shunt resistor according to claim 3, wherein:
   the bridging part has conductive parts with smaller resistivity than the resistive element and is formed by sandwiching the resistive element between the conductive parts in the extension direction of the bridging part, and
   the two bonding wires are bonded to the conductive parts sandwiching the resistive element, respectively.

5. The shunt resistor according to claim 4, wherein
   bonding positions of the two bonding wires are placed such that a distance between the bonding positions in the extension direction is a minimum with the resistive element in between.

* * * * *